US012563674B1

(12) United States Patent
Jia et al.

(10) Patent No.: US 12,563,674 B1
(45) Date of Patent: Feb. 24, 2026

(54) DISPLAY DEVICE AND ELECTRONIC APPARATUS

(71) Applicants: Beijing BOE Display Technology Co., Ltd., Beijing (CN); BOE TECHNOLOGY GROUP CO., LTD., Beijing (CN)

(72) Inventors: Yuan Jia, Beijing (CN); Wenyu Li, Beijing (CN); Yawei Chen, Beijing (CN); Weibiao Geng, Beijing (CN); Jingrui Ren, Beijing (CN); Tianyang Han, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 415 days.

(21) Appl. No.: 18/028,784

(22) PCT Filed: Jun. 2, 2022

(86) PCT No.: PCT/CN2022/096879
§ 371 (c)(1),
(2) Date: Mar. 28, 2023

(87) PCT Pub. No.: WO2023/230997
PCT Pub. Date: Dec. 7, 2023

(51) Int. Cl.
*G06F 3/041* (2006.01)
*H05K 1/189* (2026.01)
(Continued)

(52) U.S. Cl.
CPC ........... *H05K 1/189* (2013.01); *H05K 5/0018* (2022.08); *G06F 3/04164* (2019.05);
(Continued)

(58) Field of Classification Search
CPC ............................ G06F 3/04164; H05K 3/325
See application file for complete search history.

(56) References Cited

U.S. PATENT DOCUMENTS

2017/0123460 A1    5/2017   Jung
2017/0168463 A1*   6/2017   Hong ..................... H05K 1/148
(Continued)

FOREIGN PATENT DOCUMENTS

CN        103393414 B      6/2015
CN        105657967 A      6/2016
(Continued)

*Primary Examiner* — Kevin M Nguyen
(74) *Attorney, Agent, or Firm* — HOUTTEMAN LAW LLC

(57) ABSTRACT

An embodiment of the present disclosure provides a display device, including: a display module; a flexible circuit board, including: a bending portion and a device mounting portion coupled together to form a single piece, wherein the bending portion is electrically coupled to the display module; and the device mounting portion is on a non-display side of the display module, and overlaps with the display module in a thickness direction of the display module; and a processor on the device mounting portion and configured to provide a display signal to the display module. Correspondingly, the embodiment of the present disclosure also provides an electronic apparatus.

18 Claims, 4 Drawing Sheets

(51) Int. Cl.
    *H05K 5/00*         (2006.01)
    *H05K 7/20*         (2006.01)

(52) U.S. Cl.
    CPC ................... *H05K 7/20954* (2013.01); *H05K*
          *2201/10128* (2013.01); *H05K 2201/10151*
                              (2013.01)

(56) References Cited

U.S. PATENT DOCUMENTS

| | | | |
|---|---|---|---|
| 2019/0373153 A1* | 12/2019 | Zeng ...................... | H04N 23/57 |
| 2020/0364433 A1* | 11/2020 | Kim ...................... | G06F 1/1626 |
| 2021/0174111 A1* | 6/2021 | Im ...................... | H04M 1/0268 |

FOREIGN PATENT DOCUMENTS

| | | |
|---|---|---|
| CN | 205845771 U | 12/2016 |
| CN | 107134443 A | 9/2017 |
| CN | 208092749 U | 11/2018 |
| CN | 109597252 A | 4/2019 |
| CN | 111474750 A | 7/2020 |
| CN | 111725265 A | 9/2020 |
| CN | 111741594 A | 10/2020 |
| CN | 113080895 A | 7/2021 |

\* cited by examiner

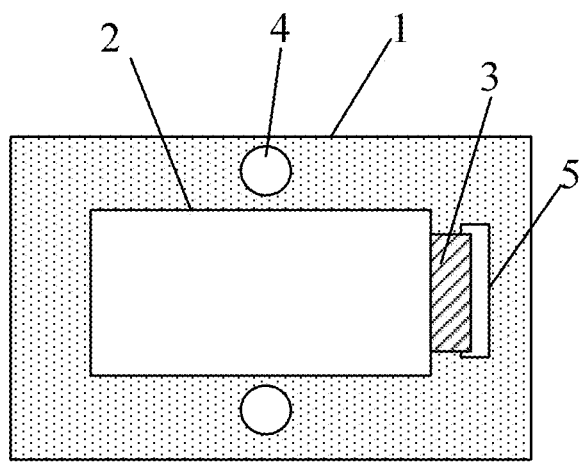
FIG. 1
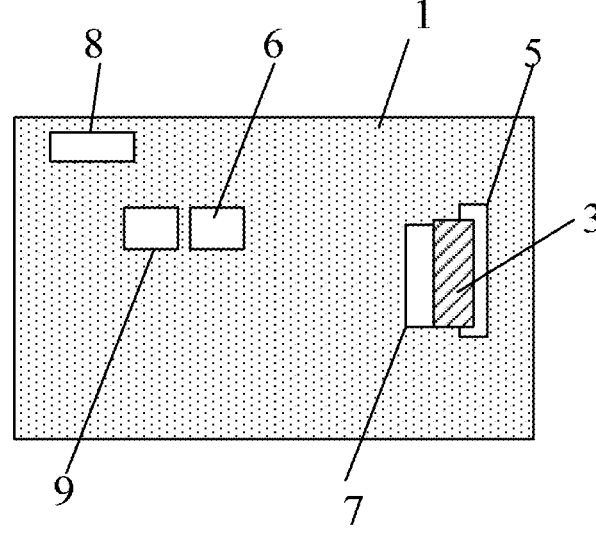
FIG. 2
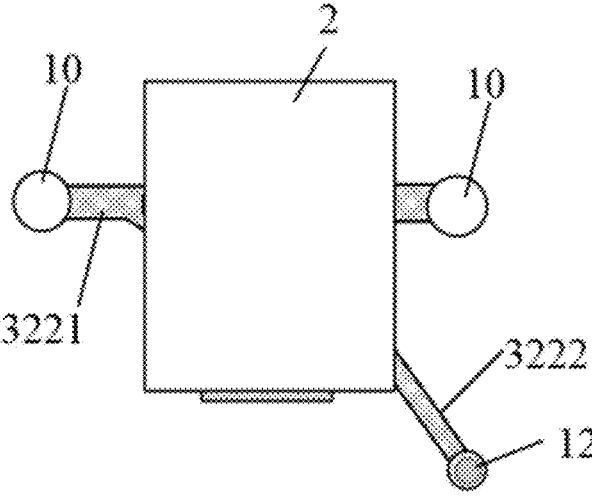

DISPLAY DEVICE AND ELECTRONIC APPARATUS

CROSS-REFERENCE TO RELATED APPLICATION

This is a National Phase Application filed under 35 U.S.C. 371 as a national stage of PCT/CN2022/096879, filed on Jun. 2, 2022, the contents of which are incorporated herein in their entirety by reference.

TECHNICAL FIELD

The present disclosure relates to the field of display technology, in particular to a display device and an electronic apparatus.

BACKGROUND

In the field of small household appliances, such as refrigerators, washing machines, floor sweeping robots, scrubbers, automatic cookers, air purifiers and the like, the man-machine interaction is realized by providing a display screen as a display operation interface. In some small household appliances, the display component usually adopts the design mode of a display module and a system board, which has a more complex installation mode and has a higher cost.

SUMMARY

The present disclosure provides a display device and an electronic apparatus.

In a first aspect, the present disclosure provides a display device, including: a display module; a flexible circuit board, including: a bending portion and a device mounting portion coupled together to form a single piece, wherein the bending portion is electrically coupled to the display module; and the device mounting portion is on a non-display side of the display module, and overlaps with the display module in a thickness direction of the display module; and a processor on the device mounting portion and configured to provide a display signal to the display module.

In some embodiments, an overlapping area of the device mounting portion and the display module is greater than or equal to ⅓ of an area of the display module.

In some embodiments, the device mounting portion is adhered to the display module by an adhesive portion.

In some embodiments, the display device further includes a signal interface on the device mounting portion and configured to electrically coupled to a system main control board; and the processor is electrically coupled to the signal interface and is configured to provide the display signal to the display module according to a control instruction provided by the system main control board.

In some embodiments, the display device further includes: a conductive part and a touch chip, wherein the touch chip is electrically coupled to the conductive part and the signal interface, and is configured to send a driving signal to the conductive part, determine whether a touch occurs or not according to a change of an electric signal on the conductive part and send a touch feedback signal to the system main control board; and wherein the conductive part and the display module do not overlap with each other in the thickness direction of the display module.

In some embodiments, the device mounting portion includes: a main portion coupled to the bending portion, and at least one strip-shaped branch structure at an edge of the main portion, the edge of the main portion includes: a first edge and a second edge; extending directions of the first edge and the second edge cross with each other; a length of the second edge is smaller than a length of the first edge, and a width of each strip-shaped branch structure is less than the length of the second edge; and wherein the processor is on the main portion, and the conductive part is on the strip-shaped branch structure.

In some embodiments, the width of each strip-shaped branch structure is less than ¼ of the length of the second edge.

In some embodiments, the touch chip is on the strip-shaped branch structure.

In some embodiments, an area of the conductive part is between 150 mm$^2$ and 530 mm$^2$.

In some embodiments, the display device further includes: a photosensitive sensor on the strip-shaped branch structure, wherein the photosensitive sensor and the conductive parts are on different strip-shaped branch structures, and the photosensitive sensor and the display module do not overlap with each other in the thickness direction of the display module; and wherein the photosensitive sensor is electrically coupled to the signal interface, and configured to generate an electric signal according to a light received by the photosensitive sensor and send the electric signal to the system main control board through the signal interface.

In some embodiments, the flexible circuit board includes: a first insulating layer; a plurality of signal wirings on the first insulating layer; and a second insulating layer on a side of the plurality of signal wirings away from the first insulating layer, wherein the processor is on a side of the second insulating layer away from the first insulating layer, and is electrically coupled to the signal wiring through a via in the second insulating layer; and the conductive part and the plurality of signal wirings are in the same layer; and the conductive part is electrically coupled to the touch chip through the signal wiring; the first insulating layer covers at least a part of the plurality of signal wirings, and does not overlap with the conductive part in the thickness direction of the display module.

In some embodiments, the device mounting portion includes a main portion including a first edge and a third edge opposite to each other; the first edge is coupled to the bending portion, the processor is on the main portion, and a distance from the processor to the first edge is smaller than a distance from the processor to the third edge; and a distance from the signal interface to the third edge is less than the distance from the processor to the third edge.

In some embodiments, the display device further includes a heat sink on a side of the device mounting portion away from the processor; and an orthographic projection of the heat sink on the device mounting portion overlaps with an orthographic projection of the processor on the device mounting portion.

In some embodiments, the flexible circuit board has a thickness between 0.1 mm and 0.3 mm.

In some embodiments, a total thickness of structures other than the display module in the display device is less than or equal to 2.8 mm.

The present disclosure also provides an electronic apparatus, including: the display device; and a shell includes a shell body and a transparent cover plate coupled to the shell body, wherein the shell body and the transparent cover plate define an accommodating cavity; and wherein the display device is fixed in the accommodating cavity, and the display module is opposite to the transparent cover plate.

In some embodiments, the display module is adhered to the transparent cover plate.

In some embodiments, the display device further includes: a photosensitive sensor; the photosensitive sensor does not overlap with the display module in the thickness direction of the display module; and a light-transmitting window on the shell body, wherein the photosensitive sensor is opposite to the light-transmitting window.

BRIEF DESCRIPTION OF DRAWINGS

The accompanying drawings, which are provided for further understanding of embodiments of the present disclosure and constitute a part of this specification, are for explaining the present disclosure together with the embodiments of the present disclosure, but are not intended to limit the present disclosure. In the drawings:

FIG. 1 is a schematic diagram of a front side of a display module and a system board after being assembled in a small household appliance in an example.

FIG. 2 is a schematic diagram of a back side of a display module and a system board after being assembled in a small household appliance in an example.

FIG. 3 is a schematic diagram of a front side of a display device according to some embodiments of the present disclosure.

DETAIL DESCRIPTION OF EMBODIMENTS

Figure 4:
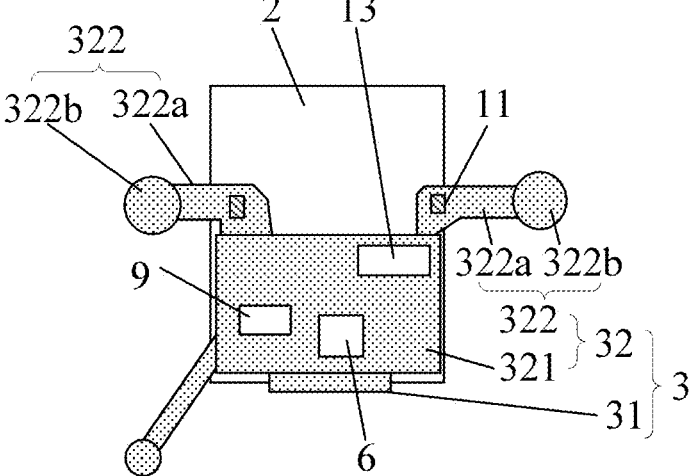
FIG. 4 is a schematic diagram of a back side of a display device according to some embodiments of the present disclosure.

In order to enable the objects, technical solutions and advantages of the embodiments of the present disclosure to be more apparent, the technical solutions of the embodiments of the present disclosure will be clearly and completely described below with reference to the drawings of the embodiments of the present disclosure. It is to be understood that the described embodiments are only a few embodiments of the present disclosure, and not all embodiments. All other embodiments, which can be derived by a person skilled in the art from the described embodiments of the present disclosure without inventive step, are within the scope of protection of the present disclosure.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term "comprise", "includes", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

In the field of small household appliances, such as refrigerators, washing machines, floor sweeping robots, scrubbers, automatic cookers, air purifiers and the like, the man-machine interaction is realized by providing a display screen as a display operation interface.

In some small household electrical appliances, a display module and a system board are electrically coupled to each other through a flexible circuit board. FIG. 1 is a schematic diagram of a front side of a display module and a system board after being assembled in a small household appliance in an example. FIG. 2 is a schematic diagram of a back side of a display module and a system board after being assembled in a small household appliance in an example. As shown in FIG. 1 and FIG. 2, the system board includes a driving circuit board 1 and a driving chip assembly disposed on the driving circuit board 1, and the driving chip assembly includes, for example, a touch chip (not shown), a processor 6, and a buffer 9 (e.g., a flash chip). The driving circuit board 1 is also provided with a plurality of pressure sensitive springs 4. The driving circuit board 1 is opposite to the display module 2, and the plurality of pressure sensitive springs 4 are provided on a surface of the driving circuit board 1 close to the display module 2, and the touch chip, the processor 6 and the buffer 9 are provided on a surface of the driving circuit board 1 away from the display module 2. A first connector 7 and a second connector 8 are provided on the surface of the driving circuit board 1 away from the display module 2. The first connector 7 is electrically coupled to one end of the flexible circuit board 3, and the other end of the flexible circuit board 3 passes through a through hole 5 in the driving circuit board 1 to be electrically coupled to the display module 2. The processor 6 is coupled to the first connector 7, the buffer 9 and the second connector 8 on the driving circuit board 1, and the plurality of pressure sensitive springs 4 are electrically coupled to the touch chip, and the touch chip is coupled to the second connector 8. The second connector 8 is configured to be coupled to a system main control board of the small household appliance.

When the pressure sensitive spring 4 is pressed or not pressed, the touch chip detects different signals, the touch chip determines whether the pressure sensitive spring 4 is pressed or not according to the corresponding signal, and sends a touch feedback signal to the system main control board, so that the system main control board sends a control instruction to the processor 6 according to the touch feedback signal. The processor 6 controls a display panel to be turned on or to switch images according to the control instruction.

The buffer 9 stores therein original image information of a plurality of images to be displayed by the small household appliance; when the processor 6 controls the display panel to display images, the processor 6 may obtain the original image information of corresponding images from the buffer 9 according to the control instruction from the system main control board, process the original image information, generate image information to be displayed (the information of the image to be displayed), and send the image information to be displayed the display module 2 for displaying the images.

In the structure shown in FIGS. 1 and 2, it needs to assemble the display module 2 with the driving circuit board 1 through the flexible circuit board 3, resulting in that the whole assembling process of the small household appliance is increased. Also, the cost of the driving circuit board 1 is high, resulting in high overall cost of the small household appliance.

Figure 5:
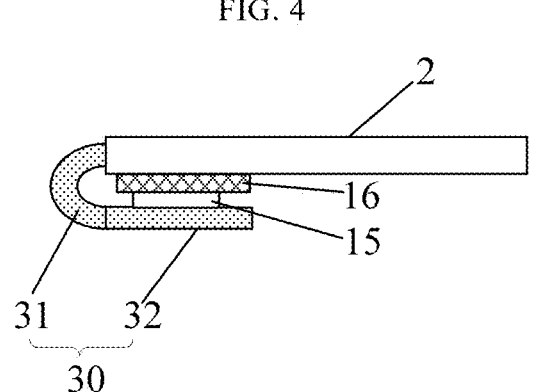
FIG. 5 is a side view of a display device according to some embodiments of the present disclosure.

The embodiment of the present disclosure provides a display device, which is applied to an electronic apparatus, and the electronic apparatus may be a small household appliance, such as a refrigerator, a washing machine, a floor sweeping robot, a scrubber, an automatic cooker, an air purifier or the like, in which a display area of the display device is small, and the content of the displayed image is simple. FIG. 3 is a schematic diagram of a front side of a display device according to some embodiments of the present disclosure. FIG. 4 is a schematic diagram of a back side of a display device according to some embodiments of the present disclosure. FIG. 5 is a side view of a display device according to some embodiments of the present disclosure. As shown in FIGS. 3 to 5, the display device includes: a display module 2, a flexible circuit board 3 and a processor 6 integrated on the flexible circuit board 3.

The display module 2 may be a liquid crystal display module, an OLED display module, a QLED display module, etc., which is not limited in the present disclosure. In addition, in the small household appliance, a size of the display module 2 is small, for example, less than 6 inches, or less than 5 inches, or less than 3 inches. In one example, the size of the display module 2 is 2.4 inches.

The flexible circuit board 3 includes a bending portion 31 and a device mounting portion 32 coupled together to form a single piece, the bending portion 31 is electrically coupled to the display module 2, the device mounting portion 32 is located on a non-display side of the display module 2, and overlaps with the display module 2 in a thickness direction of the display module 2.

The display module 2 may include a display substrate and a bonding electrode disposed on the display substrate, and the bending portion 31 being electrically coupled to the display module 2 specifically means that the bending portion 31 is electrically coupled to the bonding electrode. In addition, it should be noted that the display module 2 has a display side at which the images are displayed and the non-display side opposite to the display side. In the embodiment of the present disclosure, the two structures overlapping with each other in the thickness direction of the display module 2 means that orthographic projections of the two structures on a reference plane overlap with each other in a case where a plane parallel to the display module 2 serves as the reference plane.

The processor 6 is electrically coupled to the display module 2 through the flexible circuit board 3 and is configured to provide a display signal to the display module 2. In some embodiments, the driving chip may be a microcontroller unit (MCU), and the display signal may include an image signal. The display module 2 may further include a display driving chip disposed on the display substrate in addition to the display substrate, and the display driving chip may provide a voltage signal to pixels in the display substrate according to the image signal, so as to enable the display panel to display a corresponding image.

In the embodiment of the present disclosure, the processor 6 in the display device is integrated on the flexible circuit board 3, and in this case, when assembling the display device, the display module 2 is required to be assembled with the flexible circuit board 3 only, without being assembled with the driving circuit board, so as to improve the assembly efficiency of the product. In addition, the flexible circuit board 3 is lower in cost, thickness, and weight than the driving circuit board, thereby reducing the cost, the thickness, and the weight of the display device.

In some embodiments, an overlapping area of the device mounting portion 32 and the display module 2 is greater than or equal to ⅓ of an area of the display module 2, so that a sufficient mounting area can be provided. For example, the overlapping area of the device mounting portion 32 and the display module 2 is ⅓, ½, or ⅔ of the area of the display module 2.

The overlapping area of the device mounting portion 32 and the display module 2 refers to the overlapping area of the device mounting portion 32 and the display module 2 in the thickness direction of the display module 2. The area of the display module 2 may specifically refer to an area of a surface of the display module 2 away from the device mounting portion 32.

In some embodiments, an orthographic projection of the device mounting portion 32 on a plane where the display module 2 is located may be completely located in the area where the display module 2 is located, so as to fix the device mounting portion 32 and the display module 2.

In some embodiments, the device mounting portion 32 is adhered to the display module 2 through an adhesive portion 16, so that when assembling the display device with a shell of the small household appliance, it needs to adhere and fix only the display module 2 and the shell together, without fixing the flexible circuit board 3 and the shell together by fasteners such as screws, so that the whole machine can be conveniently assembled. The adhesive portion 16 may be a continuous adhesive film layer or a plurality of discontinuous adhesive structures. For example, the adhesive portion 16 may be a continuous double-sided adhesive layer, or include a plurality of double-sided adhesive strips.

It should be noted that the device mounting portion 32 is adhered to the display module 2 through the adhesive portion 16, which does not mean that only the adhesive portion 16 exists between the device mounting portion 32 and the display module 2. In some embodiments, as shown in FIG. 5, a heat sink 15 may further be provided on a surface of the device mounting portion 32 close to the display module 2, and the adhesive portion 16 is provided between the heat sink 15 and the display module 2. By providing the heat sink 15, the heat in the flexible circuit board 3 can be dissipated, and the problem of excess temperature caused by the integration of the processor 6 on the flexible circuit board 3 is avoided.

The heat sink 15 may be made of a material having a relatively good heat dissipation effect and a relatively high hardness, so as to provide a certain supporting force for the flexible circuit board 3 while achieving the good heat dissipation effect. For example, the heat sink 15 is made of a steel sheet.

In some embodiments, a thickness of the heat sink 15 is less than or equal to 1 mm, so that the overall thickness of the display device is small.

Figure 6:
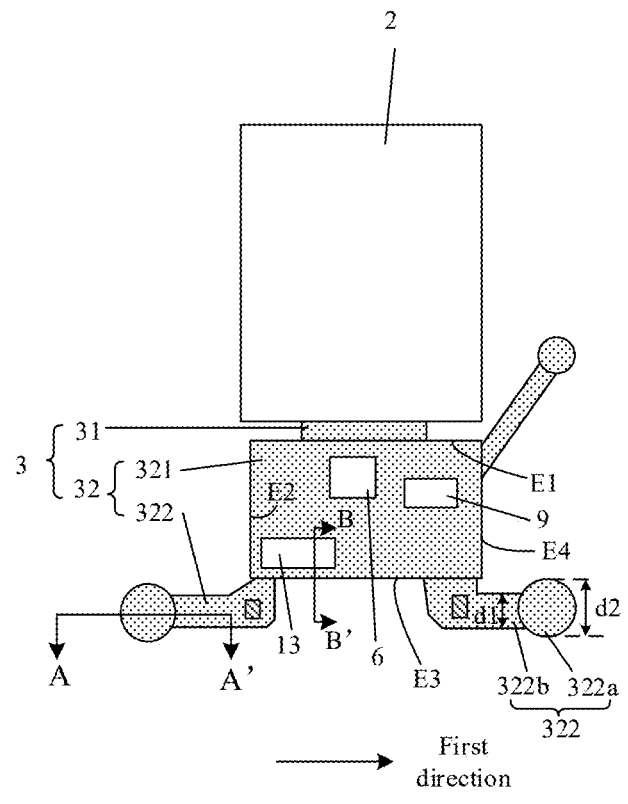
FIG. 6 is a schematic diagram of a connection between a flexible circuit board and a display module after being unfolded.

FIG. 6 is a schematic diagram of a connection between a flexible circuit board and a display module after being unfolded. As shown in FIG. 6, in some embodiments, the device mounting portion 32 has a first edge E1 coupled to the bending portion 31, the first edge E1 extends along a first direction, and a size of the bending portion 31 in the first direction is smaller than a length of the first edge E1, so that the bending portion 31 is easily bent.

As shown in FIG. 6, the device mounting portion 32 is provided with a signal interface 13 for electrically coupling to the system main control board. When the display device is used in the small household appliance, the image content displayed by the display device is relatively simple, and the amount of data transmitted by the signal interface is relatively small, so that an interface with fewer pins can be used. For example, the signal interface 13 is an 8-pin interface. The display device may further include: a buffer 9 configured to store the original image information of the plurality of images.

The processor 6 is electrically coupled to the signal interface 13 and the buffer 9, and is specifically configured to receive a control instruction sent by the system main control board through the signal interface 13 and provide a display signal to the display module according to the control instruction. In some examples, the display device may further include the buffer 9 (e.g., the flash chip), and the processor 6 may be further coupled to the buffer 9, obtain the original image information of the corresponding image from the buffer 9 according to the control instruction provided by the system main control board, process the original image information, generate the image information to be displayed, and send the image information to be displayed to the display module 2.

In some embodiments, the processor 6 may send the image information to be displayed to the display driving chip in the display module 2, so that the display driving chip provides a driving voltage to the display substrate for displaying the image according to the image to be displayed. Alternatively, in other embodiments, the processor 6 and the display driving chip may be integrated into one chip, so as to further improve the integration level of the chip and simplify the structure of the display device.

In some embodiments, the processor 6 is located on a side of the device mounting portion 32 away from the display module 2. Since the processor 6 processes data and generates a large amount of heat during operation of the display device, the heat sink 15 may be disposed at a position corresponding to the processor 6, that is, an orthographic projection of the heat sink 15 on the device mounting portion 32 overlaps with an orthographic projection of the processor 6 on the device mounting portion 32, thereby dissipating heat from the processor 6. An area of the heat sink 15 may be set to be small as long as it can cover the area where the processor 6 is located, and the heat sink may not be provided at other positions, to not affect the overall thickness and weight of the display device.

Further, the display device further includes: a conductive part 10 and the touch chip 11, wherein the touch chip 11 is electrically coupled to the conductive part 10 and the signal interface 13, and the touch chip 11 is configured to send an electric signal to the conductive part 10, determine whether a touch occurs according to the change of the electric signal on the conductive part 10 and send the touch feedback signal to the system main control board. The conductive part 10 and the display module 2 do not overlap with each other in the thickness direction of the display module 2, that is, an orthographic projection of the conductive part 10 on a reference plane does not overlap with an orthographic projection of the display module 2 on the reference plane in a case where a plane parallel to the display module 2 is used as the reference plane.

The conductive part 10 may be a metal sheet and is electrically coupled to the touch chip 11 through a signal wiring. For example, the conductive part may be coupled to a connection port of the touch chip 11 through one signal wiring. When the display device is in operation, the touch chip 11 sends a driving signal, which may be a current signal, to the conductive part 10. A parasitic capacitor is formed between the conductive part 10 and another signal line (e.g., a ground line) on the flexible circuit board, so that when the current signal is output to the conductive part 10, the parasitic capacitor is charged. By detecting a rate of change of a voltage signal on the conductive part 10, a rate of charging of the capacitor formed by the conductive part 10 may be determined. When the conductive part is not touched, the capacitor by the conductive part 10 is the parasitic capacitor, and the rate of charging is constant. When a touch object (e.g. a finger) approaches the conductive part 10, a capacitor (referred to as a first capacitor) is formed between the touch object and the conductive part 10, and is superposed on the constant parasitic capacitor. That is, the capacitor formed by the conductive part 10 changes, so that the rate of change of the voltage on the conductive part 10 changes, and the rate of charging also changes. The change of the rate of charging of the touch chip 11 indicates that the conductive part 10 is touched, and the touch chip 11 sends the touch feedback signal to the system main control board, so that the system main control board sends the control instruction to the processor 6 according to the touch feedback signal. The processor 6 controls the display panel to be turned on or to switch images according to the control instruction. Alternatively, in other embodiments, the touch chip 11 may also be directly coupled to the processor 6, so as to directly send the touch feedback instruction to the processor 6, and when receiving the touch feedback instruction, the processor 6 controls the display panel to be turned on or to switch the images according to the touch feedback instruction.

It can be understood that when an area of the conductive part 10 is too small, a finger is not easy to touch the conductive part 10 in use; when the area of the conductive part 10 is too large, the parasitic capacitor between the conductive part 10 and the ground is too large, and thus, when the touch occurs, the first capacitor formed between the finger and the conductive part 10 has a small influence on the rate of charging, and thus the touch chip is not easy to detect the occurrence of the touch. Therefore, in the embodiment of the present disclosure, the area of the conductive part 10 is set to be between 150 mm$^2$ and 530 mm$^2$, so as to improve the accuracy of touch detection. For example, the area of the conductive part 10 is 150 mm$^2$, 300 mm$^2$, 400 mm$^2$, 500 mm$^2$, or 530 mm$^2$.

It should be noted that the area of the conductive part 10 refers to an area of an orthographic projection of the conductive part 10 on the plane where the display module 2 is located.

The conductive part 10 may be circular, square or other irregular shapes. In one example, the conductive part 10 is circular and has a diameter in a range of 7 mm to 13 mm, for example, 7 mm, 10 mm or 13 mm.

In one example, the display device may include a plurality of conductive parts 10 and a plurality of touch chips 11. For example, the plurality of conductive parts 10 includes a first conductive part and a second conductive part, and the plurality of touch chips 11 includes, for example, a first touch chip and a second touch chip, the first conductive part is electrically coupled to the first touch chip, and the second conductive part is electrically coupled to the second touch chip 11. When the first conductive part is touched, the first touch chip sends a first feedback signal to the system main control board, the system main control board sends a first control instruction to the processor 6 according to the first feedback signal, and the processor 6 controls the display module 2 to be turned on according to the first control instruction; when the second conductive part is touched, the second touch chip sends a second feedback signal to the system main control board, the system main control board sends a second control instruction to the processor 6 according to the second feedback signal, and the processor 6 controls the display module 2 to switch images according to the second control instruction.

In some embodiments, as shown in FIG. 6, the device mounting portion 32 includes: a main portion 321 coupled to the bending portion 31, and at least one strip-shaped branch structure 322 disposed at an edge of the main portion 321, the main portion 321 and the at least one strip-shaped branch structure 322 are coupled together to form a single piece. The buffer 9 and the processor 6 are disposed on the main portion 321, and the conductive part 10 is disposed on the strip-shaped branch structure 322. In one example, each conductive part 10 is disposed on one corresponding strip-shaped branch structure 322, and different conductive parts 10 are disposed on different strip-shaped branch structures 322.

The main portion 321 may have a polygonal structure, such as a rectangular structure or a rectangular structure having rounded corners. The edge of the main portion 321 includes: a first edge E1 and a second edge E2. Extending directions of the first edge E1 and the second edge E2 cross with each other, a length of the second edge E2 is smaller than a length of the first edge E1, and a width of each strip-shaped branch structure 322 is smaller than the length of the second edge E2. That is, the width of each strip-shaped branch structure 322 is smaller than the length of the short side of the main portion 321, so that the area of the flexible circuit board 3 can be reduced as much as possible. When the flexible circuit board is fabricated, a mother board of the flexible circuit board may be divided to form a plurality of flexible circuit boards with required shapes, and when the area of the flexible circuit board required by the display device is reduced, the mother board of the flexible circuit board may be divided into the greater number of the flexible circuit boards, so that the fabrication cost is reduced.

Each strip-shaped branch structure 322 may include: a branch head 322a and a connection portion 322b coupled between the branch head 322a and the main portion 321; the branch head 322a may have a circular shape, a square shape, or another shape, the connection portion 322b may have a strip-shaped structure extending along a certain direction. Assuming that a width of the connection portion is d1 and a dimension of the branch head 322a in a width direction of the connection portion 322b is d2, the width of the strip-shaped branch structure 322 may refer to the larger one of d1 and d2.

It should be noted that the term "strip-shaped structure" as used herein means that the structure as a whole extends in a certain direction, and does not mean that an edge of the structure is necessarily a straight line.

It should also be noted that the shapes of the different strip-shaped branch structures 322 may be necessarily identical to each other.

In some embodiments, the width of the strip-shaped branch structure 322 is less than ¼ of the length of the second edge E2, so as to minimize the overall area of the flexible circuit board 3 and reduce the cost. When designing an actual product, the width of the connection portion 322b can be reduced as much as possible, as long as the normal wiring on the strip-shaped branch structure 322 is not affected.

In some embodiments, as shown in FIG. 4, the touch chip 11 is also disposed on the strip-shaped branch structure 322, for example, on the connection portion 322b of the strip-shaped branch structure 322. The touch chip 11 is disposed on the strip-shaped branch structure 322, so that the touch chip 11 is closer to the conductive part 10, thereby reducing a length of the wiring therebetween, reducing a capacitance of the parasitic capacitor between the wiring and the ground line, and preventing the sensitivity of the touch detection from being affected by the larger parasitic capacitance. Moreover, the touch chip 11 is disposed on the strip-shaped branch structure 322, and thus does not occupy the space on the main portion 321, so that more space is left on the main portion 321 for providing other devices.

It should be understood that when the at least one conductive part 10 includes a plurality of conductive parts 10 and the at least one touch chip 11 includes a plurality of touch chips 11, the plurality of conductive parts 10 and the plurality of touch chips 11 may be in a one-to-one correspondence with each other, and the touch chip 11 and the conductive part 10 corresponding thereto are disposed on the same strip-shaped branch structure 322.

Figure 7A:
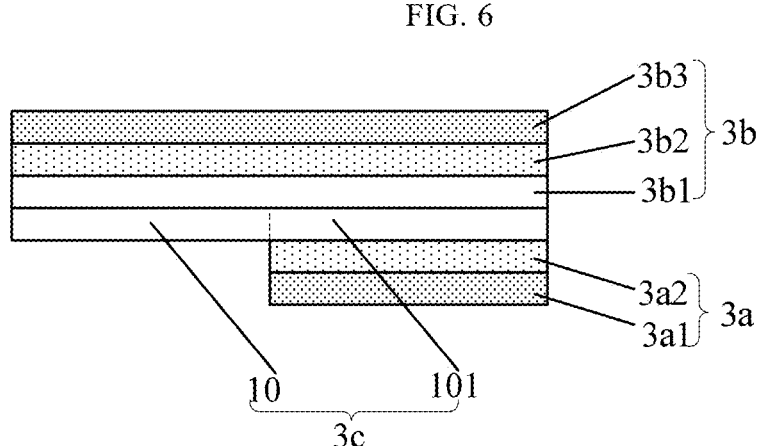
FIG. 7A is a sectional view taken along a line A-A' in FIG. 6.
Figure 7B:
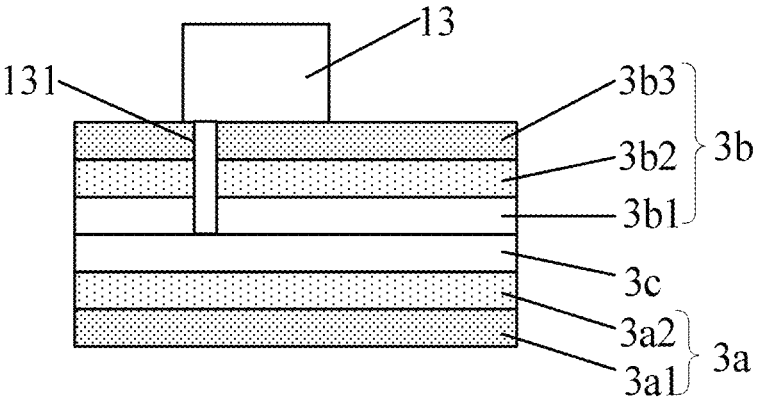
FIG. 7B is a sectional view taken along a line B-B' of FIG. 6.

FIG. 7A is a sectional view taken along a line A-A' in FIG. 6. FIG. 7B is a sectional view taken along a line B-B' of FIG. 6. As shown in FIGS. 7A and 7B, in some embodiments, the flexible circuit board 3 includes: a first insulating layer 3a, a second insulating layer 3b and a wiring layer 3c, wherein the wiring layer 3c includes a plurality of signal wirings arranged on the first insulating layer 3a; the second insulating layer 3b is located on a side of the plurality of signal wirings away from the first insulating layer 3a. A material of the wiring layer 3c may include copper; in one example, the first insulating layer 3a may include: a first insulating sub-layer 3a1 and a first adhesive layer 3a2 between the first insulating sub-layer 3a1 and the wiring layer 3c; a material of the first insulating sub-layer 3a1 may include, for example, polyimide. The second insulating layer 3b may include: a second insulating sub-layer 3b1, a second adhesive layer 3b2 and a third insulating sub-layer 3b3; the second adhesive layer 3b2 is located between the second insulating sub-layer 3b1 and the third insulating sub-layer 3b3, the third insulating sub-layer 3b3 is located on a side of the second insulating sub-layer 3b1 away from the wiring layer 3c, and materials of the second insulating sub-layer 3b1 and the third insulating sub-layer 3b3 may both include polyimide.

FIG. 7A only illustrates one conductive part and a part of the strip-shaped branch structure where the conductive part is located. Other parts of the flexible circuit board 3 (such as the strip-shaped branch structures where other conductive parts are located) may have a similar structure. The main portion 321 also includes the first insulating layer 3a, the second insulating layer 3b, and the plurality of signal wirings. The buffer 9 and the processor 6 are both disposed on a side of the second insulating layer 3b away from the first insulating layer 3a, and are electrically coupled to the signal wirings in the wiring layer 3c through vias in the second insulating layer 3b. It can be understood that the buffer 9 and the processor 6 being electrically coupled to the signal wirings in the wiring layer 3c through the vias in the second insulating layer 3b means that a pin 131 of the buffer 9 and a pin of the processor 6 are electrically coupled to the signal wirings in the wiring layer 3c through the vias in the second insulating layer 3b.

The conductive parts 10 and the signal wirings 101 are disposed in the same layer, and the conductive parts 10 are electrically coupled to the touch chips through the signal wirings 101 in the wiring layer 3c. That is, each conductive part 10 and the signal wiring 101 coupled thereto are formed as a single piece. It should be understood that the signal wirings 101 coupled to the conductive parts 10 and the signal wirings coupled to the buffer 9 and the processor 6 are all located in the wiring layer 3c, but the conductive parts 10 and the buffer 9 are coupled to different signal wirings, and the conductive parts 10 and the processor 6 are also coupled to different signal wirings.

As shown in FIG. 7A, the first insulating layer 3a covers at least a portion of each signal wiring, and the first insulating layer 3a and the conductive part 10 do not overlap with each other in the thickness direction of the display module 2, i.e., a portion of the conductor (or conductive line) in the wiring layer 3c is exposed by the first insulating layer 3a, thereby forming the conductive part 10. Since the conductive part 10 is a part of the wiring layer 3c of the flexible circuit board 3, it is not necessary to assemble the conductive part 10 with the flexible circuit board 3 like pressure sensitive springs, thereby improving the production efficiency.

In addition, ink layers may be coated on a surface of the conductive part 10 away from the second insulating layer 3b, and a surface of the first insulating layer 3a away from the second insulating layer 3b. When the display device is installed in a shell of an electronic apparatus, in an area where the shell does not cover the conductive part 10, the ink layer serves as a dielectric layer when a finger touches the ink layer on the conductive part 10, so that the first capacitor is formed between the conductive part 10 and the finger. In an area where an insulating part of the shell covers the conductive part 10, the ink layer and the insulating part of the shell together serve as a dielectric layer when a finger touches the ink layer on the conductive part 10, so that the first capacitor is formed between the conductive part 10 and the finger.

In addition, as described above, the display device in the embodiment of the present disclosure is particularly suitable for small household electrical appliances, in which the content of the image of the display device is relatively simple, and the types of signals transmitted among the chips are relatively few, so that only one wiring layer is disposed in the flexible circuit board 3, and thus the cost and thickness of the flexible circuit board 3 are reduced, and the cost and thickness of the entire display device are reduced in a case where the display requirement is met.

It should be noted that FIGS. 7A and 7B are sectional views taken along the cutting lines in FIG. 6. The flexible circuit board is in an unfolded state, in FIG. 6, the conductive part 10 faces in the inside of the paper, and the processor 6 and the signal interface 13 faces in the outside of the paper surface. Thus, in FIG. 7A, the conductive part 10 is located at the bottom in FIG. 7A, and in FIG. 7B, the signal interface 13 is located at the top in FIG. 7B. In practical application, the flexible circuit board 3 is in a bending state, the orientation of the conductive part 10 is the same as a light outgoing direction of the display module 2, and the signal interface 13 is located on a side of the main portion 321 of the flexible circuit board 3 away from the display module 2. For example, the display device is located in the shell of the electronic apparatus, the display module 2 faces the top of the shell, and the conductive part 10 also faces the top of the shell.

In some embodiments, a thickness of the flexible circuit board 3 is between 0.1 mm and 0.3 mm, thereby advantageously reducing the overall thickness of the display device. For example, the thickness of the flexible circuit board 3 is 0.1 mm, 0.2 mm or 0.3 mm.

A thickness of each of the devices (such as the buffer 9, the processor 6 and the like) on the flexible circuit board 3 is less than or equal to 1 mm, a thickness of the heat sink 15 is less than or equal to 1 mm, and a thickness of the adhesive portion 16 is less than or equal to 0.5 mm. That is, in the display device, the total thickness of the structures other than the display module 2 is less than or equal to 2.8 mm, so that the whole thickness of the display device is reduced, the space of the shell of the electronic apparatus occupied by the display device is reduced, and the fixing of the display device is facilitated.

In one example, the heat sink 15 has a thickness of 1 mm, 0.8 mm, 0.6 mm or 0.4 mm, and the adhesive portion 16 has a thickness of 0.5 mm, 0.4 mm, 0.3 mm, 0.2 mm or 0.1 mm; each device on the flexible circuit board 3 has a thickness of 1 mm, 0.8 mm, 0.6 mm or 0.4 mm.

As shown in FIG. 6, the main portion 321 includes: a first edge E1 and a third edge E3 opposite to each other, and a second edge E2 and a fourth edge E4 opposite to each other; the first edge E1 of the main portion 321 is the first edge E1 of the device mounting portion 32, and is coupled to the bending portion 31, an extending direction of the second edge E2 and an extending direction of the fourth edge E4 both intersect with (for example, are substantially perpendicular to) an extending direction of the first edge E1; and the third edge E3 is substantially parallel to the first edge E1. A distance from the processor 6 to the first edge E1 is less than that from the processor 6 to the third edge E3, thereby reducing the wiring distance between the processor 6 and the display module 2. Because a large amount of image information need be transmitted between the processor 6 and the display module 2 at a high speed, the reduction of the wiring distance between the processor 6 and the display module 2 can improve the signal transmission quality between the processor 6 and the display module 2. In addition, a distance from the signal interface 13 to the third edge E3 is smaller than that from the processor 6 to the third edge E3, and a distance from the signal interface 13 to the second edge E2 is smaller than that from the processor 6 to the second edge E2, that is, the signal interface 13 is disposed near the edge of the main portion 321, so as to facilitate the electrical connection between the signal interface 13 and the system main control board.

In some embodiments, resistors, capacitors, and other devices (not shown) are further disposed on the flexible circuit board 3, and some of these devices are disposed on a side of the processor 6 close to the second edge E2. In this case, as shown in FIG. 6, the buffer 9 may be disposed on a side of the processor 6 close to the fourth edge E4, so as to improve the compactness of the arrangement for the devices, and reduce the wiring distance between the buffer 9 and the processor 6, thereby improving the transmission reliability.

In some embodiments, as shown in FIG. 6, the display device further includes: a photosensitive sensor 12, the photosensitive sensor 12 is disposed on a strip-shaped branch structure 322, the photosensitive sensor 12 and the conductive parts 10 are disposed on different strip-shaped branch structures 322, and the photosensitive sensor 12 and the display module 2 do not overlap with each other in the thickness direction of the display module 2. The photosensitive sensor 12 is located on a side of the first insulating layer 3*a* away from the second insulating layer 3*b*.

The photosensitive sensor 12 is electrically coupled to the signal interface 13, and configured to generate a corresponding electrical signal according to the sensed light, and transmit the electrical signal to the system main control board through the signal interface 13, so that the system main control board controls the display mode of the display module 2 according to the electrical signal generated by the photosensitive sensor 12.

For example, when the light of the surrounding environment is dark, a voltage of the electrical signal generated by the photosensitive sensor 12 is low, the system main control board sends a third control instruction to the processor 6 according to the low electrical signal, and the processor 6 adjusts the image information to be displayed according to the third control instruction, so as to reduce the display brightness of the display module 2; when the light of the surrounding environment is bright, the voltage of the electrical signal generated by the photosensitive sensor 12 is high, the system main control board sends a fourth control instruction to the processor 6 according to the high electrical signal, and the processor 6 adjusts the image information to be displayed according to the fourth control instruction so as to improve the display brightness of the display module 2.

It should be noted that in other embodiments, the signal generated by the photosensitive sensor 12 may also be directly sent to the processor 6, and the processor 6 adjusts the image of the display module 2 directly according to the signal from the photosensitive sensor 6.

The embodiment of the present disclosure also provides an electronic apparatus, which is a small household appliance such as a refrigerator, a washing machine, a floor sweeping robot, a scrubber, an automatic cooker, an air purifier or the like. The electronic apparatus includes the display device described above and a shell, wherein the shell includes a shell body and a transparent cover plate coupled to the shell body, the shell body and the transparent cover plate define an accommodating cavity in which the display device is provided.

Figure 8:
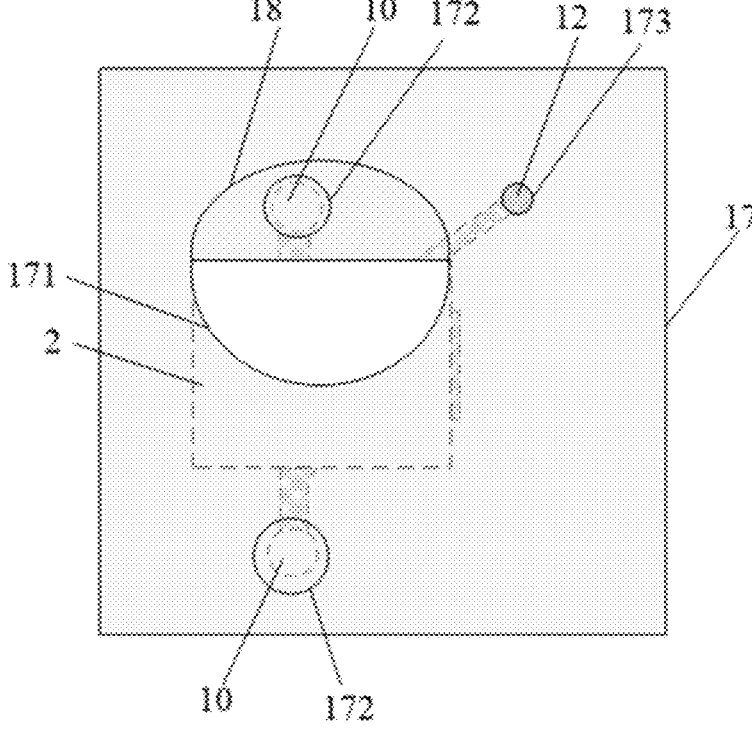
FIG. 8 is a schematic diagram of a partial a structure of an electronic apparatus according to some embodiments of the present disclosure.

FIG. 8 is a schematic diagram of a partial structure of an electronic apparatus according to some embodiments of the present disclosure. The shell body may include a plurality of walls, for example, a bottom wall, a top wall, and a plurality of side walls. A first light-transmitting window is provided in one of the walls (e.g., the top wall), and the transparent cover plate is positioned at the first light-transmitting window. FIG. 8 shows only one wall 17 of the shell body, the transparent cover plate 171 and the display device provided on the wall 17. As shown in FIG. 8, the display module 2 of the display device is disposed opposite to the transparent cover plate 171. "The display module 2 being disposed opposite to the transparent cover plate 171" means that at least a portion of the display area of the display module 2 is opposite to the transparent cover plate 171, so that a user can see the image displayed by the display module 2 through the transparent cover plate 171. The transparent cover plate 171 may be a glass cover plate or a cover plate made of an organic material such as polyimide.

The display module 2 of the display device is adhered to the transparent cover plate 171, so that the display device is fixed in the shell body. Compared with fixing the display device by fasteners such as screws and the like, such the fixing way by means of the adhesive is more beneficial to the assembly of the display device and the shell. The entire surface of the display module 2 close to the transparent cover plate 171 may be all adhered to the transparent cover plate 171, thereby improving the connection stability. It can be understood that the display module 2 and the transparent cover plate 171 are adhered together by a transparent adhesive structure.

A second light-transmitting window 17 may be further provided in the shell body, and the photosensitive sensor 12 is disposed opposite to the second light-transmitting window 173 for sensing the ambient light. The second light-transmitting window 173 may or may not be provided with a transparent protective layer.

In some embodiments, the branch head 322*a* of each strip-shaped branch structure 322 may be further coupled to the shell, for example, a surface of the branch head 322*a* away from the transparent cover plate 171 is adhered to the shell by using an adhesive tape, so that the strip-shaped branch structure 322 is prevented from shaking up and down due to the gravity, thereby ensuring the stability of the conductive part 10 relative to the shell and the stability of the photosensitive sensor relative to the shell.

As shown in FIG. 8, preset touch areas 172 are provided on the shell body, the touch areas 172 are in a one-to-one correspondence with the conductive parts 10, and the touch area 172 is opposite to the corresponding conductive part 10. In practical applications, a specific mark pattern or a special pattern such as a recess may be formed in the touch area, so that the user can clearly identify the touch position. When a human hand touches the touch area 172, the first capacitor is formed between the finger and the conductive part 10, so that the touch chip determines that a touch occurs. The specific detection principle has been described as above, and thus, is not repeated here.

In some embodiments, as shown in FIG. 8, a portion 18 of the shell body may adopt a structure including a transparent layer and a light shielding layer; the light shielding layer may be an ink coated onto the transparent layer, the transparent layer and the transparent cover plate may have a single piece. One of the touch areas 172 may be located on the structure including the transparent layer and the light shielding layer. In this case, when the finger touches the touch area 172, the first capacitor is formed between the finger and the conductive part 10, and the transparent layer and the light shielding layer may serve as the dielectric layer of the first capacitor.

In some embodiments, the electronic apparatus further includes the system main control board (not shown) electrically coupled to the signal interface 13 on the flexible circuit board 3. The system main control board may be fixed on the wall of the shell in the adhesive manner, or by fasteners such as screws, which is not limited in the present disclosure.

It should be noted that in the above embodiments, the expression for the numerical range from m1 to m2 includes the end points m1 and m2.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display device, comprising:

a display module;

a flexible circuit board, comprising: a bending portion and
    a device mounting portion coupled together to form a single piece, wherein the bending portion is electrically coupled to the display module, and the device mounting portion is on a non-display side of the display module, and overlaps with the display module in a thickness direction of the display module; and a processor on the device mounting portion and configured to provide a display signal to the display module, wherein the display device further comprises a signal interface on the device mounting portion and configured to electrically coupled to a system main control board, wherein the processor is electrically coupled to the signal interface and is configured to provide the display signal to the display module according to a control instruction provided by the system main control board, wherein the display device further comprises:

a conductive part and a touch chip, wherein the touch chip is electrically coupled to the conductive part and the signal interface, and is configured to send a driving signal to the conductive part, determine whether a touch occurs or not according to a change of an electric signal on the conductive part and send a touch feedback signal to the system main control board based on a determination result; and wherein the conductive part and the display module do not overlap with each other in the thickness direction of the display module.

2. The display device according to claim 1, wherein an overlapping area of the device mounting portion and the display module is greater than or equal to ⅓ of an area of the display module.

3. The display device according to claim 1, wherein the device mounting portion is adhered to the display module by an adhesive portion.

4. The display device according to claim 3, wherein the device mounting portion comprises a main portion comprising a first edge and a third edge opposite to each other; the first edge is coupled to the bending portion, the processor is on the main portion, and a distance from the processor to the first edge is smaller than a distance from the processor to the third edge; and a distance from the signal interface to the third edge is less than the distance from the processor to the third edge.

5. The display device according to claim 1, wherein the device mounting portion comprises: a main portion coupled to the bending portion, and at least one strip-shaped branch structure at an edge of the main portion, the edge of the main portion comprises: a first edge and a second edge, extending directions of the first edge and the second edge cross with each other, a length of the second edge is smaller than a length of the first edge, and a width of each strip-shaped branch structure is less than the length of the second edge; and wherein the processor is on the main portion, and the conductive part is on the strip-shaped branch structure.

6. The display device according to claim 5, wherein the width of each strip-shaped branch structure is less than ¼ of the length of the second edge.

7. The display device according to claim 5, wherein the touch chip is on the strip-shaped branch structure.

8. The display device according to claim 5, wherein the display device further comprises:

a photosensitive sensor on the strip-shaped branch structure, wherein the strip-shaped branch structure comprises a plurality of strip-shaped branch structures, the photosensitive sensor and the conductive parts are on different strip-shaped branch structures, and the photosensitive sensor and the display module do not overlap with each other in the thickness direction of the display module; and wherein the photosensitive sensor is electrically coupled to the signal interface, and configured to generate an electric signal according to a light received by the photosensitive sensor and send the electric signal to the system main control board through the signal interface.

9. The display device according to claim 1, wherein an area of the conductive part is between 150 mm$^2$ and 530 mm$^2$.

10. The display device according to claim 1, wherein the flexible circuit board comprises:

a first insulating layer;

a plurality of signal wirings on the first insulating layer; and a second insulating layer on a side of the plurality of signal wirings away from the first insulating layer;

wherein the processor is on a side of the second insulating layer away from the first insulating layer, and is electrically coupled to the signal wiring through a via in the second insulating layer; and the conductive part and the plurality of signal wirings are in a same layer; and the conductive part is electrically coupled to the touch chip through the signal wiring; the first insulating layer covers at least a part of the plurality of signal wirings, and does not overlap with the conductive part in the thickness direction of the display module.

11. The display device according to claim 1, wherein the display device further comprises a heat sink on a side of the device mounting portion away from the processor; and an orthographic projection of the heat sink on the device mounting portion overlaps with an orthographic projection of the processor on the device mounting portion.

12. The display device according to claim 1, wherein the flexible circuit board has a thickness between 0.1 mm and 0.3 mm.

13. The display device according to claim 1, wherein a total thickness of structures other than the display module in the display device is less than or equal to 2.8 mm.

14. An electronic apparatus, comprising:

the display device according to claim 1; and a shell comprises a shell body and a transparent cover plate coupled to the shell body, wherein the shell body and the transparent cover plate define an accommodating cavity; and wherein the display device is fixed in the accommodating cavity, and the display module is opposite to the transparent cover plate.

15. The electronic apparatus according to claim 14, wherein the display module is adhered to the transparent cover plate.

16. The electronic apparatus according to claim 15, wherein the display device further comprises: a photosensitive sensor; the photosensitive sensor does not overlap with the display module in the thickness direction of the display module; and a light-transmitting window on the shell body, wherein the photosensitive sensor is opposite to the light-transmitting window.

17. The electronic apparatus according to claim 16, wherein the photosensitive sensor is further configured to control brightness of an image to be displayed by the display module based on an intensity of a light received by the photosensitive sensor.

18. The display device according to claim 1, wherein
the conductive part comprises a first conductive part and
a second conductive part, the touch chip comprises a
first touch chip and a second touch chip, the first
conductive part is electrically coupled to the first touch 5
chip, and the second conductive part is electrically
coupled to the second touch chip,
the display module is configured to be turned on in
response to a first feedback signal sent by the first touch
chip in a case where the first conductive part is touched, 10
and
the display module is further configured to switch images
in response to a second feedback signal sent by the
second touch chip in a case where the second conduc-
tive part is touched. 15

\*  \*  \*  \*  \*